(12) United States Patent
Uramoto

(10) Patent No.: US 9,627,412 B2
(45) Date of Patent: Apr. 18, 2017

(54) LIQUID CRYSTAL DISPLAY DEVICE

(71) Applicant: Japan Display Inc., Tokyo (JP)

(72) Inventor: Seiichi Uramoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/789,340

(22) Filed: Jul. 1, 2015

(65) Prior Publication Data
US 2016/0005769 A1    Jan. 7, 2016

(30) Foreign Application Priority Data

Jul. 2, 2014   (JP) .................................. 2014-136793

(51) Int. Cl.
| | |
|---|---|
| *H01L 27/12* | (2006.01) |
| *H01L 29/786* | (2006.01) |
| *G02F 1/1368* | (2006.01) |
| *G02F 1/1362* | (2006.01) |
| *G02F 1/1343* | (2006.01) |

(52) U.S. Cl.
CPC ...... *H01L 27/1222* (2013.01); *G02F 1/13439* (2013.01); *H01L 27/1237* (2013.01); *H01L 29/78645* (2013.01); *G02F 1/1368* (2013.01); *G02F 1/134363* (2013.01); *G02F 1/136286* (2013.01); *G02F 2001/13629* (2013.01); *G02F 2001/13685* (2013.01); *G02F 2001/136218* (2013.01); *G02F 2201/128* (2013.01); *G02F 2202/104* (2013.01)

(58) Field of Classification Search
CPC ............. G02F 1/1343; G02F 1/136286; G02F 1/1368; G02F 1/133345; G02F 1/136227; G02F 1/136204; G02F 1/134309; G02F 1/134363; G02F 1/1362; G02F 2001/136218; H01L 27/1214; H01L 27/3248; H01L 27/3262; H01L 29/78609; H01L 29/42324; H01L 29/78645
USPC .... 257/59, 72, E29.273, E29.129, 29.3, 187, 257/315; 349/43, 39, 42, 138, 141, 143, 349/46
See application file for complete search history.

(56) References Cited

U.S. PATENT DOCUMENTS

| | | |
|---|---|---|
| 6,396,470 B1 | 5/2002 | Zhang et al. |
| 2006/0017139 A1* | 1/2006 | Eguchi .............. G02F 1/136204 257/656 |

FOREIGN PATENT DOCUMENTS

JP    2000-275676 A    10/2000

* cited by examiner

*Primary Examiner* — Thoi Duong
(74) *Attorney, Agent, or Firm* — Typha IP LLC

(57) ABSTRACT

The invention provides a high-precision display device having a reliable top- and single-gate TFT causing less current leakage. Part of a gate line 10 that crosses a semiconductor layer 103 acts as a gate electrode to form a TFT. The semiconductor layer 103 is connected to a data line 20 via a through-hole 140 on one side of the TFT and also connected to a contact electrode 107 via a through-hole 120 on the other side of the TFT. A floating electrode 30 is formed between the TFT and the through-hole 140 or between the TFT and the through-hole 120. The floating electrode 30 is formed on a layer above the semiconductor layer 103 with the use of the same material and at the same time as the gate electrode.

7 Claims, 9 Drawing Sheets

LIQUID CRYSTAL DISPLAY DEVICE

CLAIM OF PRIORITY

The present application claims priority from Japanese Patent Application JP 2014-136793 filed on Jul. 2, 2014, the content of which is hereby incorporated by reference into this application.

BACKGROUND OF THE INVENTION

1. Field of the Invention

The present invention relates to display devices and particularly to a display device having a high-precision screen.

2. Description of the Related Art

A liquid crystal display (LCD), a type of display device, comprises a TFT (thin film transistor) substrate, a counter substrate, and a liquid crystal layer sandwiched between the two substrates. On the TFT substrate, pixels are formed in the form of a matrix, and the pixels each include a pixel electrode and a TFT. Images are produced by controlling the transmittance rate of light passing through the liquid crystal molecules on a pixel-by-pixel basis. Since LCDs are flat and lightweight, the range of their application is getting wider in various fields. For instance, small-sized LCDs are widely used in cell phones, DSCs (digital still camera), and so on.

In small- and middle-sized LCDs, top-gate TFTs and poly-Si semiconductor layers are often used. This is because Poly-Si is larger in mobility than a-Si and a drive circuit can be formed on the TFT substrate. JP-2000-275676-A discloses a LCD using such TFTs. JP-2000-275676-A teaches that it is effective to use double-gate TFTs to reduce leakage current.

SUMMARY OF THE INVENTION

High precision is increasingly demanded of small- and middle-sized LCDs. In a high-precision screen, the size of a pixel is as small as 17 μm×51 μm. For such a tiny pixel, it is difficult to use a double-gate TFT due to the limited space. Thus, the only option left is to use a single-gate TFT.

However, with a single-gate TFT, voltage increases per channel, resulting in an increase in current leakage or even in a breakdown of the TFT due to insulation breakdown. In the case of a double-gate TFT, even if one TFT goes out of order, the other TFT still work; thus, the pixel is not immediately rendered defective.

An object of the invention is thus to provide a reliable method for manufacturing LCDs having single-gate TFTs.

To achieve the above object, the invention provides the following means.

(1) A liquid crystal display device comprising: a TFT substrate including: a plurality of gate lines extending in a first direction and arranged in a second direction; a plurality of data lines extending in the second direction and arranged in the first direction; and a plurality of pixel electrodes formed in the areas surrounded by the plurality of gate lines and the plurality of data lines; a counter substrate; and a liquid crystal layer sandwiched between the TFT substrate and the counter substrate, wherein a semiconductor layer and a gate electrode form a TFT with a gate insulating film placed therebetween, wherein the semiconductor layer is connected to one of the plurality of data lines via a first through-hole on one side of the TFT and also connected to a contact electrode via a second through-hole on the other side of the TFT, wherein the contact electrode is connected to one of the plurality of pixel electrode, and wherein a floating electrode is formed between the gate electrode and the second through-hole on a layer above the semiconductor layer, the floating electrode being fabricated with the same material and at the same time as the gate electrode.

(2) The liquid crystal display device recited in (1), wherein the TFT is used for a pixel.

(3) The liquid crystal display device recited in (1), wherein the gate electrode is one of the plurality of gate lines.

(4) The liquid crystal display device recited in (1), wherein the distance between the gate electrode and the floating electrode in the extending direction of the semiconductor layer is in the range of 1 to 3 μm.

(5) The liquid crystal display device recited in (1), wherein the distance between the gate electrode and the floating electrode in the extending direction of the semiconductor layer is in the range of 1 to 2 μm.

(6) The liquid crystal display device recited in (1), wherein the length of the floating electrode in the extending direction of the semiconductor layer is equal to or greater than the length of the gate electrode in the extending direction of the semiconductor layer.

(7) The liquid crystal display device recited in (1), wherein the width of the floating electrode in a direction perpendicular to the extending direction of the semiconductor layer is less than the width of the one of the plurality of data lines and greater than the width of the semiconductor layer.

(8) A display device comprising: a display area; and a drive circuit having a TFT formed near the periphery of the display area, wherein the TFT is formed by placing a gate electrode on a semiconductor layer via a gate insulating film, and wherein a floating electrode is formed on the high voltage side of the gate insulating film with respect to the TFT, the flowing electrode being fabricated with the same material and at the same time as the gate electrode and located on a layer above the semiconductor layer.

DESCRIPTION OF THE PREFERRED EMBODIMENTS

Before explaining specific embodiments of the invention, we first describe the structure of an IPS (In-Plane Switching) LCD. Note however that the invention can be applied not only to IPS LCDs but also to other types of LCDs such as TN (Twisted Nematic) and VA (Vertical Alignment) LCDs.

In LCDs, viewing angle characteristics are an important issue. When an LCD has poor viewing angle characteristics, the screen luminance and the colors displayed on the screen tend to change greatly depending on viewing angles. When it comes to viewing angle characteristics, the IPS scheme offers excellent performance. In IPS LCDs, lateral electric fields are used to drive liquid crystal molecules.

Figure 1:
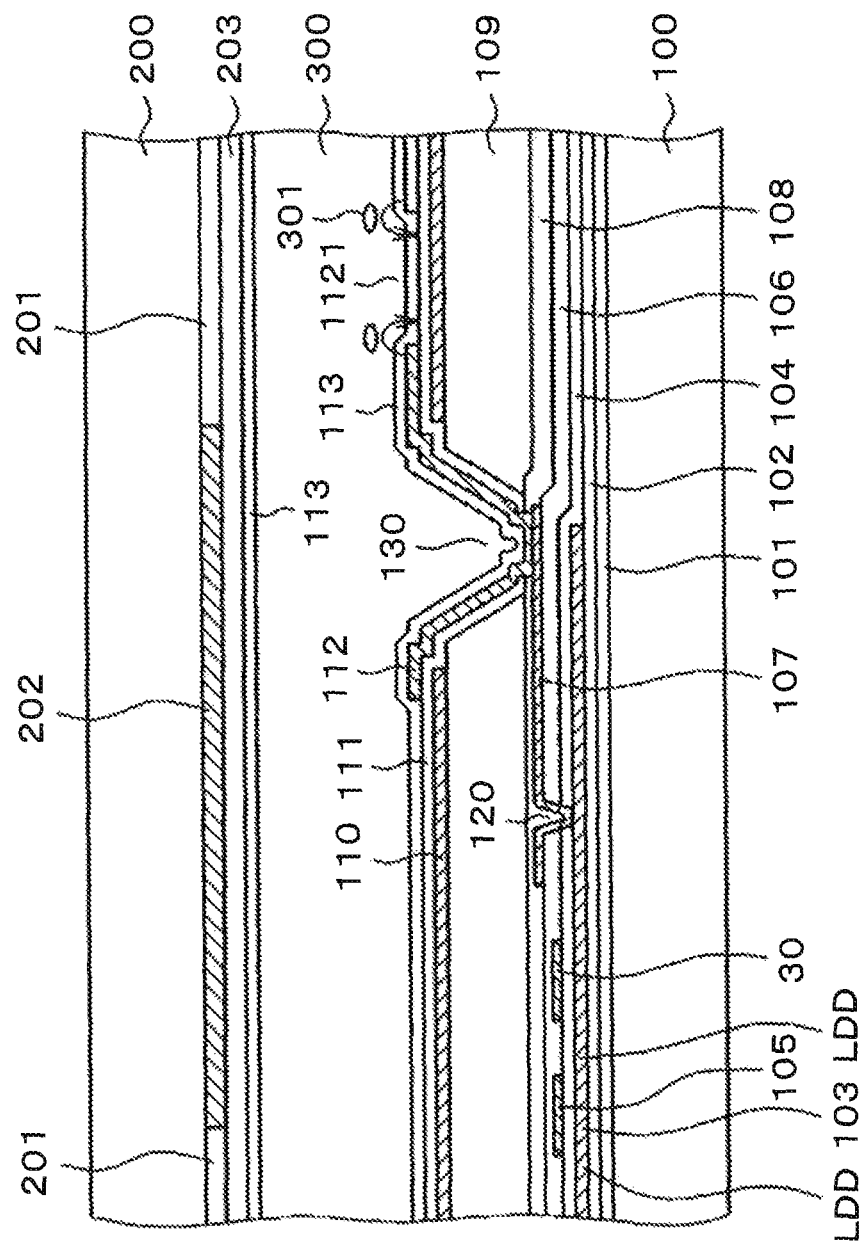
FIG. 1 is a cross section of an LCD to which the invention is applied.

FIG. 1 is a cross section of an IPS LCD. The TFT of FIG. 1 is a so-called top-gate TFT, and the semiconductor used therein is LIPS (low temperature polycrystalline silicon). As illustrated in FIG. 1, a first undercoat 101 (SiN) and a second undercoat 102 (SiO$_2$) are formed on a glass substrate 100 by chemical vapor deposition (CVD). The first undercoat 101 and the second undercoat 102 play the role of preventing the contamination of a semiconductor layer 103 by impurities from the glass substrate 100.

The semiconductor layer 103 is formed on the second undercoat 102. The semiconductor layer 103 is formed by first depositing an a-Si film on the second undercoat 102 by CVD and then laser-annealing the film to convert it into a poly-Si film. This poly-Si film is subjected to photolithographic patterning.

Figure 2:
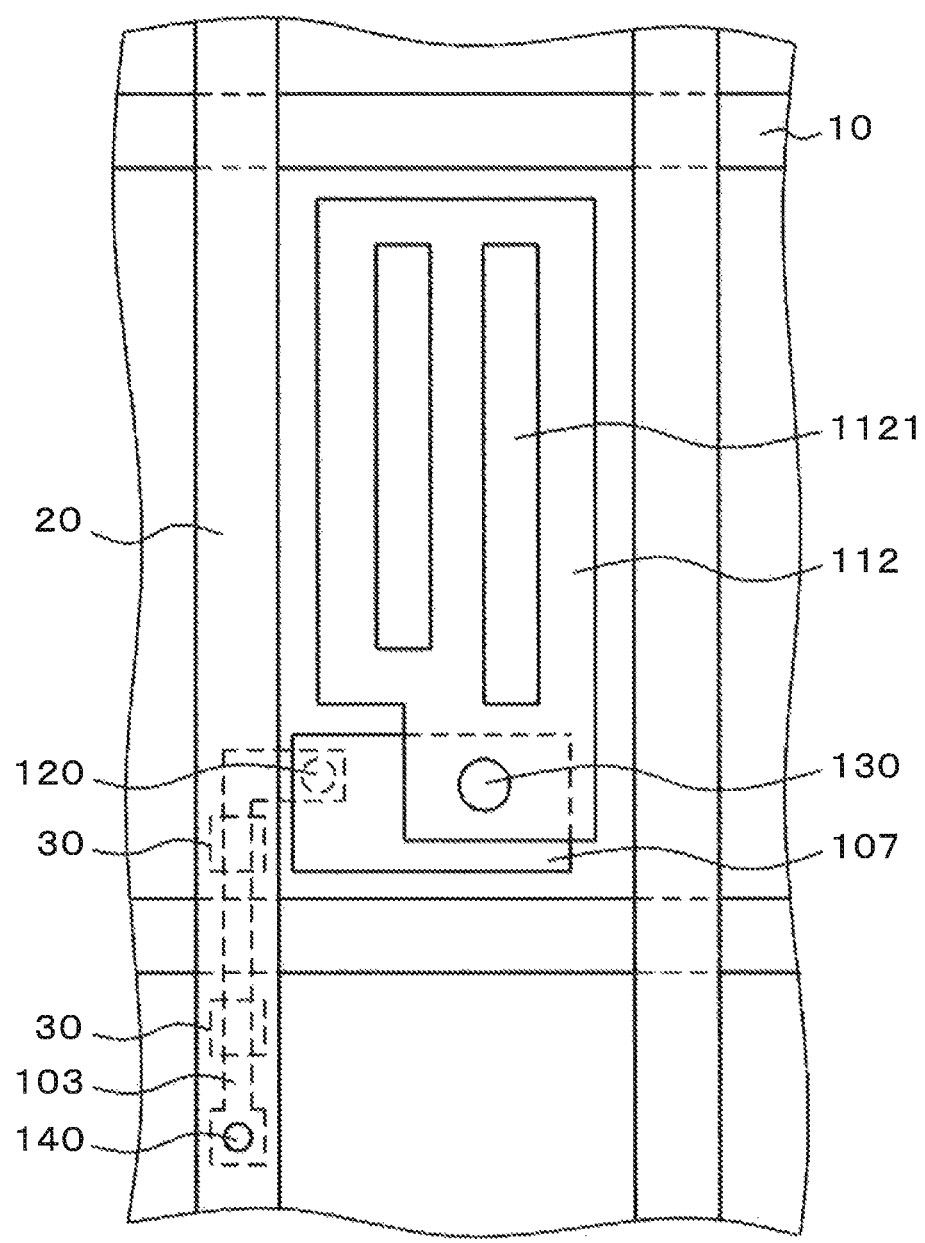
FIG. 2 is a plan view of a pixel according to an embodiment of the invention.

Formed on the semiconductor layer 103 is a gate insulating film 104, which is an SiO$_2$ film formed from TEOS (tetraethyl orthosilicate). The gate insulating film 104 is also deposited by CVD. Formed on the gate insulating film 104 is a gate electrode 105. As illustrated in FIG. 2, the gate electrode 105 also acts as a gate line 10. The gate electrode 105 is formed, for example, of a MoW film. When the resistance of the gate electrode 105 (or gate line 10) needs to be decreased, an Al alloy is used.

The gate electrode 105 is subjected to photolithographic patterning. During this patterning, an impurity such as phosphorous or boron is doped into the poly-Si layer by ion implantation to form a source electrode S or a drain electrode D on the poly-Si layer. Also, with the use of the photoresist used for the patterning of the gate electrode 105, an LDD (lightly doped drain) layer is formed between the channel layer of the poly-Si layer and the source electrode S or the drain electrode D. This is done to prevent the intensity of electric fields from increasing locally.

Formed between the gate electrode 105 and a contact electrode 107, described later, is a floating electrode 30. The floating electrode 30 is formed at the same level and at the same time as the gate electrode 105, and it literally "floats." The presence of the floating electrode 30 decreases leakage current even in the case of a single-gate TFT; it also helps prevent the application of an excessively intense electric filed to the TFT. The floating electrode also takes less space.

A first inter-layer insulating film 106 (SiO$_2$) is formed to cover the gate electrode 105 and the floating electrode 30. The first inter-layer insulating film 106 is used to insulate the gate electrode 105 from the contact electrode 107. Formed in the first inter-layer insulating film 106 and the gate insulating film 104 is a through-hole 120, which connects the semiconductor layer 103 and the contact electrode 107. The photolithography needed to form the through-hole 120 is simultaneously performed on the first inter-layer insulating film 106 and the gate insulating film 104.

The contact electrode 107 is formed on the first inter-layer insulating film 106. The contact electrode 107 is in contact with a pixel electrode 112 via a through-hole 130. Although not illustrated in FIG. 1, the semiconductor layer 103 is connected to the data line 20 of FIG. 2 via a through-hole 140.

The contact electrode 107 and the data line 20 are formed at the same level and at the same time. The contact electrode 107 and the data line 20 (hereinafter the two are referred to collectively as the contact electrode 107) are formed, for example, of an AlSi alloy to achieve a small resistance. Because AlSi alloys are prone to hillock formation and Al tends to diffuse to other layers, the AlSi alloy is sandwiched between barrier and cap layers (MoW layers, not illustrated).

An inorganic passivation film 108 (insulating film) is formed to cover the contact electrode 107 and protect the entire TFT. Similar to the first undercoat 101, the inorganic passivation film 108 is deposited by CVD. Formed on the inorganic passivation film 108 is an organic passivation film 109. The organic passivation film 109 is formed of a photosensitive acrylic resin; it can also be formed of a silicone resin, an epoxy resin, a polyimide resin, or the like. The organic passivation film 109 is formed thick because it needs to act also as a planarizing film. The thickness of the organic passivation film 109 is in the range of 1 to 4 μm and in most cases about 2 μm.

To establish an electric connection between the pixel electrode 112 and the contract electrode 107, the through-hole 130 is formed in the inorganic passivation film 108 and the organic passivation film 109. As stated above, the organic passivation film 109 is formed of a photosensitive resin. After the application of the photosensitive resin, it is exposed to light, thereby causing only the light-exposed portions to melt into a developing solution and forming the through-hole 130. Thus, the use of the photosensitive resin makes a photoresist unnecessary. After the through-hole 130 has been formed in the organic passivation film 109, the film is baked at about 230 degrees Celsius.

Thereafter, ITO (indium tin oxide) is sputtered to form a common electrode 110. Patterning is then performed such that the sputtered ITO is removed from the through-hole 130 and its nearby area. The common electrode 110 is formed flat and shared by all the pixels. A second inter-layer insulting film 111 (SiN) is then formed over the entire surface of the TFT by CVD. To establish an electric connection between the contact electrode 107 and the pixel electrode 112, the through-hole 130 is then formed in the second inter-layer insulating film 111 and the inorganic passivation film 108.

Figure 5:
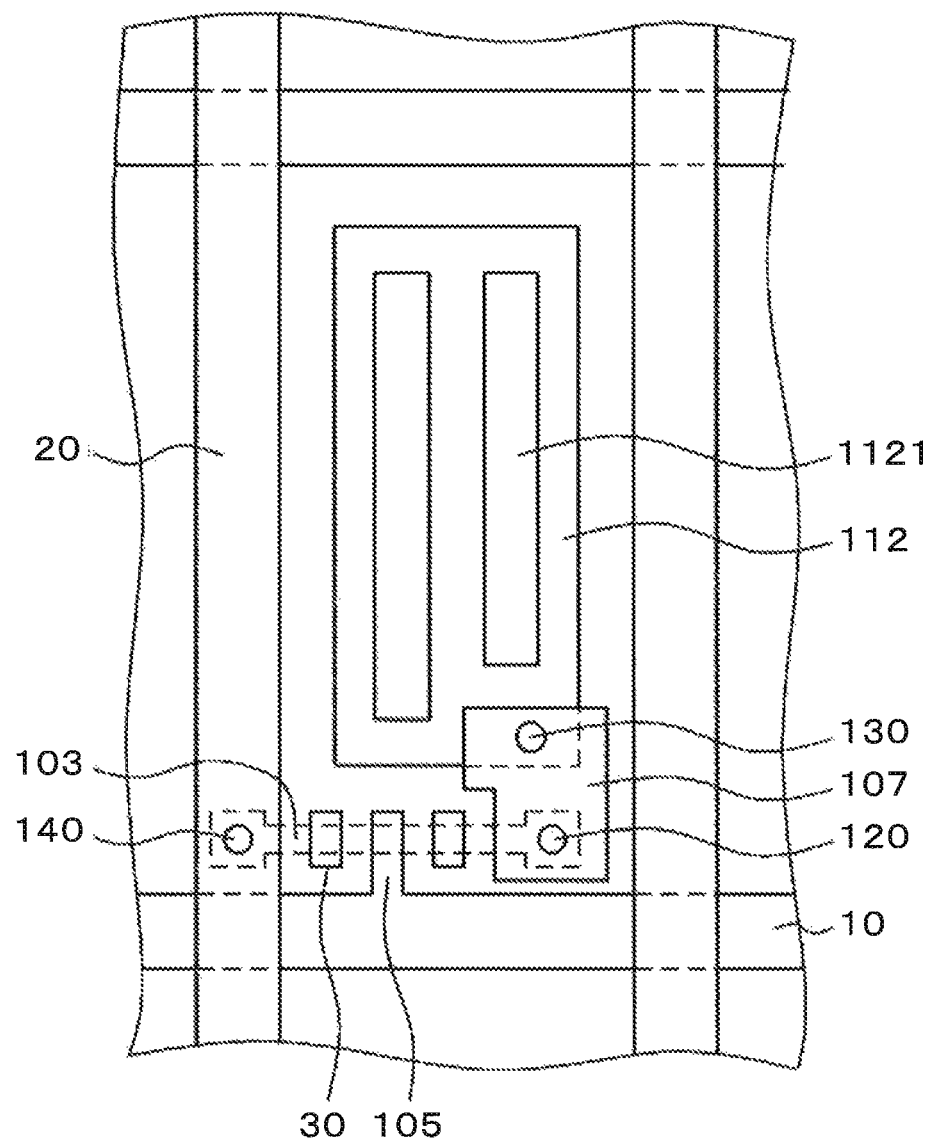
FIG. 5 is a plan view of a pixel according to another embodiment of the invention.

Subsequently, the pixel electrode 112 is formed by sputtering ITO and subjecting it to patterning. FIGS. 2, 5, and so forth illustrate the shape of the pixel electrode 112 of the invention when viewed from above. An alignment material is applied onto the pixel electrode 112 by flexography or inkjet printing and then baked to from an alignment film 113. To perform alignment treatment on the alignment film 113, either the rubbing method or the photo-alignment method using polarized ultraviolet light can be used.

Voltage application between the pixel electrode 112 and the common electrode 110 results in the electric force lines shown in FIG. 1. Those electric fields cause liquid crystal molecules 301 to rotate, thereby controlling the amount of light passing through a liquid crystal layer 300 on a pixel-by-pixel basis to produce an image.

As illustrated in FIG. 1, a counter substrate 200 is located across from the glass substrate 100 with the liquid crystal layer 300 inserted therebetween. Underneath the counter substrate 200 is a color filter 201. The color filter 201 of each pixel includes red, green, and blue filters to produce a color image. A black matrix 202 is formed between the color filter 201 of a pixel and the color filter 201 of an adjacent pixel to increase image contrast. The black matrix 202 acts also as a light-blocking film for the TFT and prevents the flow of photocurrent to the TFT.

Formed underneath the color filter 201 and the black matrix 202 is an overcoat 203. Because the color filter 201 and the black matrix 202 have surface irregularities, the overcoat 203 is used to make them flat. Underneath the overcoat 203 is another alignment film 113 to determine the initial alignment of the liquid crystals. To perform alignment treatment on this alignment film 113, either the rubbing method or the photo-alignment method using polarized ultraviolet light can be used, as is similar to the alignment film 113 on the side of the TFT substrate 100.

The above LCD structure is only meant to be an example. For instance, depending on the LCD type, the TFT substrate 100 may not have the organic passivation film 108. The fabrication process of the through-hole 130 may also vary from LCD to LCD. Note also that the present invention can be applied not only to top-gate structures but also to bottom-gate structures. Further, the invention can be applied even to a-Si TFTs. We now describe an embodiment of the invention with reference to the accompanying drawings.

Embodiment 1

FIG. 2 is a plan view of a pixel according to an embodiment of the invention. As illustrated in FIG. 2, gate lines 10 extend in a lateral direction and are arranged in a vertical direction at particular intervals. Also, data lines 20 extend in a vertical direction and are arranged in a lateral direction at particular intervals. Each pixel is formed at the area surrounded by two gate lines 10 and two data lines 20. As illustrated in FIG. 2, a semiconductor layer 103 is formed below a data line 20 and a gate line 10. The semiconductor layer 103 is connected to the data line 20 via a through-hole 140.

The semiconductor layer 103 extends along and below the data line 20 and is bent to enter a pixel. The semiconductor layer 103 also extends below the gate line 10 to cross it. At the place where the semiconductor layer 103 crosses the gate line 10, the gate line 10 acts as the gate electrode 105 of a TFT. In other words, a TFT is formed where the semiconductor layer 103 crosses the gate line 10. Within the pixel, the semiconductor layer 103 is connected to a contact electrode 107 via a through-hole 120. The contact electrode 107 is connected to a pixel electrode 112 via a through-hole 130. The pixel electrode 112 is substantially in the form of a comb having slits 1121.

The TFTs of the invention are of a top-gate type as illustrated in FIG. 1 and also of a single-gate type as illustrated in FIG. 2. Conventionally, single-gate TFTs have reliability issues: they are prone to current leakage, and electric fields tend to be strong near the TFTs. Thus, in the present invention, one or two floating electrodes 30 are formed near each TFT, thereby weakening electric fields, suppressing increases in current leakage, and ensuring TFT reliability.

Because the floating electrodes 30 need not be connected to other electrodes, they can be easily disposed in a small space, even in tiny pixels of a high-precision screen. In the example of FIG. 2, two floating electrodes 30 are formed such that a TFT is sandwiched between the two floating electrodes 30. However, depending on the layout, only one floating gate can be formed near the TFT. This also brings about similar advantageous effects.

Figure 3:
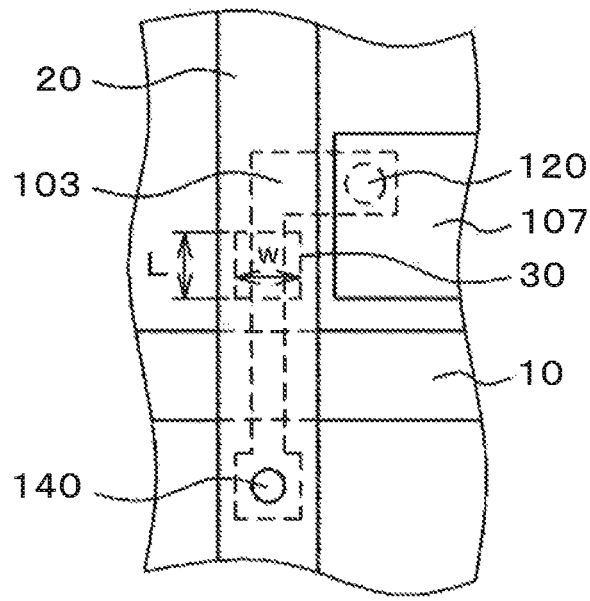
FIG. 3 illustrates a modification of FIG. 2.

FIG. 3 shows an example in which one floating electrode 30 is disposed on the side close to the contact electrode 107 and no floating electrode is disposed on the side close to the through-hole 140. In FIG. 3, the width of the floating electrode 30 is denoted by the letter "w," and the length of the semiconductor layer 103 in its extending direction is denoted by the letter "L." The width w is larger than the width of the semiconductor layer 103 and smaller than the width of the data line 20. This is so because the transmittance rate of the pixel may decrease if the width w is larger than the width of the data line 20. Also, greater effects can be achieved when the length L of the floating electrode 30 is made larger than the width of the gate line 10.

Figure 4:
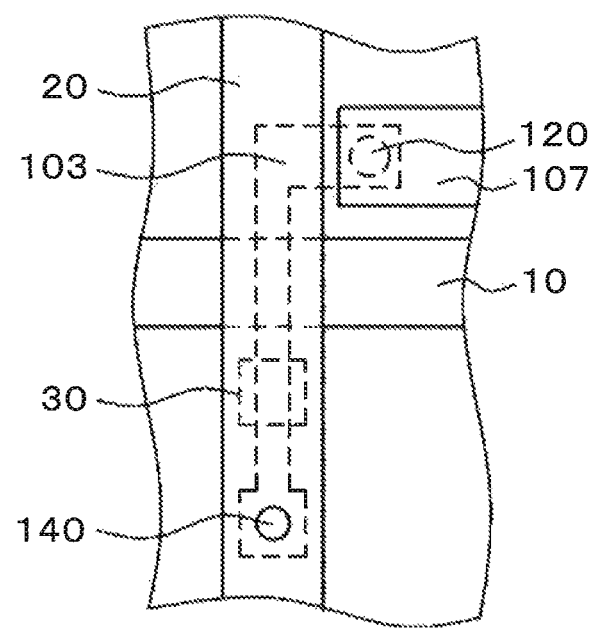
FIG. 4 illustrates another modification of FIG. 2.

Conversely, FIG. 4 shows an example in which a floating electrode 30 is disposed on the side close to the through-hole 140 and no floating electrode is disposed on the side close to the contact electrode 107. The desired dimensions of the floating electrode 30 are the same as in the case of FIG. 3; they stay the same also when a TFT is sandwiched between two floating electrodes 30 as in the case of FIG. 2.

FIG. 5 is a plan view of a pixel according to another embodiment of the invention. In FIG. 5, the semiconductor layer 103 extends from below a data line 20 through below the gate electrode 105 to below the contact electrode 107. The semiconductor layer 103 is connected to the data line 20 via the through-hole 140 and to the contact electrode 107 via the through-hole 120. The contact electrode 107 is connected to the pixel electrode 112 via the through-hole 130. The pixel electrode 112 is substantially in the form of a comb having slits 1121.

The gate electrode 105 diverges from a gate line 10, and a TFT is formed where the gate electrode 105 is located. A floating electrode 30 is formed between the TFT and the through-hole 140. Another floating electrode 30 is formed between the TFT and the through-hole 120. These two floating electrodes 30 are formed in the same layer and with the same material as the gate electrode 105.

The two floating electrodes 30 weaken the electric fields applied to the TFT, which in turn prevents the electric fields from breaking the TFT. The floating electrodes 30 also prevent current leakage in the TFT. The desired dimensions of the floating electrodes 30 of FIG. 5 are the same as in the case of FIG. 3. That is, the length of each of the floating electrodes 30 in the extending direction of the semiconductor layer 103 is desirably equal to or greater than the width of the gate electrode 105. In addition, the width of each of the floating electrodes 30 in a direction perpendicular to the extending direction of the semiconductor layer 103 is desirably equal to or greater than the width of the semiconductor layer 103. It should be noted that the shape of the floating electrodes 30 can be flexibly selected depending on the layout.

Figure 6:
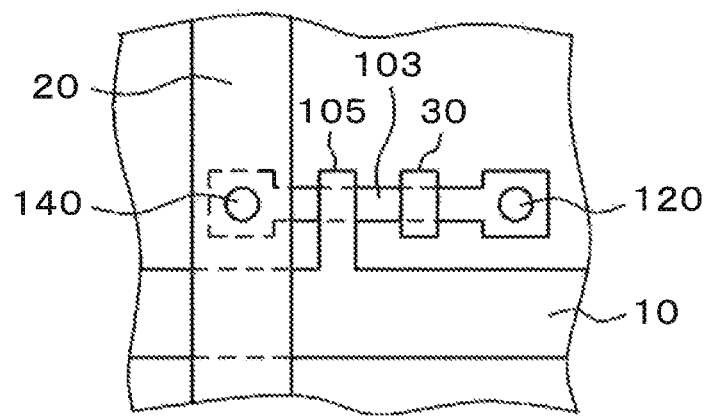
FIG. 6 illustrates a modification of FIG. 5.
Figure 7:
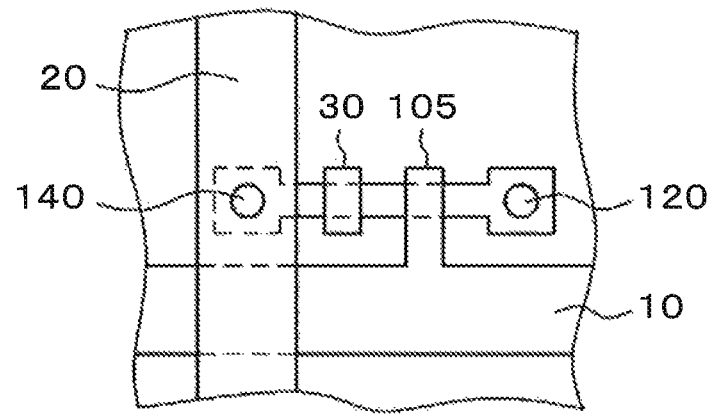
FIG. 7 illustrates another modification of FIG. 5.

Although the TFT is sandwiched between the two floating electrodes 30 in FIG. 5, only one of them can be present. FIG. 6 shows an example in which a floating electrode 30 is present on the side close to the through-hole 120 and no floating electrode is present on the side close to the through-hole 140. Conversely, FIG. 7 shows an example in which a floating electrode 30 is present on the side close to the through-hole 140 and no floating electrode is present on the side close to the through-hole 120.

Figure 8:
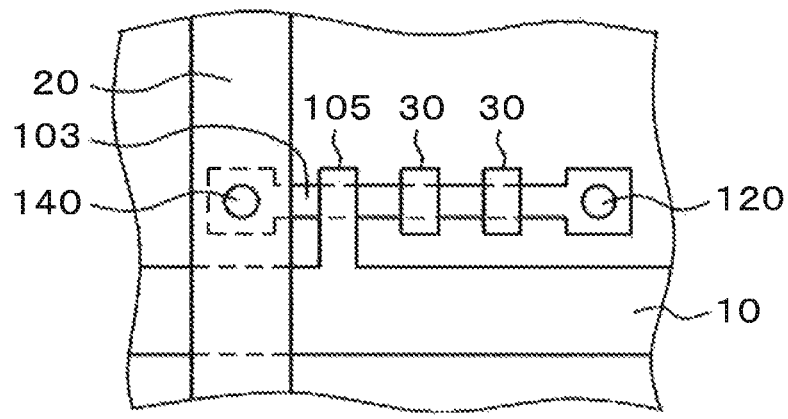
FIG. 8 illustrates still another modification of FIG. 5.

FIG. 8 illustrates an example in which two floating electrodes 30 are present on the side close to the through-hole 120 and no floating electrode is present on the side close to the through-hole 140. As in those figures, floating electrodes 30 can be arranged flexibly depending on the layout or the like.

Figure 9:
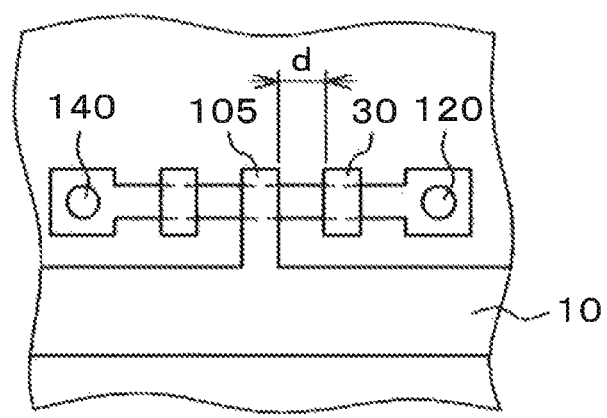
FIG. 9 is a plan view of a pixel used for an experiment.

The distance between the gate electrode 105 and a floating electrode 30 has a large effect on weakening the intensity of electric fields in the TFT. FIG. 9 is a plan view illustrating the positional relation among the semiconductor layer 103, the gate electrode 105, and a floating electrode 30. In FIG. 9, the distance between the gate electrode 105 and the floating electrode 30 is denoted by the letter "d," and the widths of the gate electrode 105 and the floating electrode 30 in the extending direction of the semiconductor layer 103 are the same.

Figure 10:
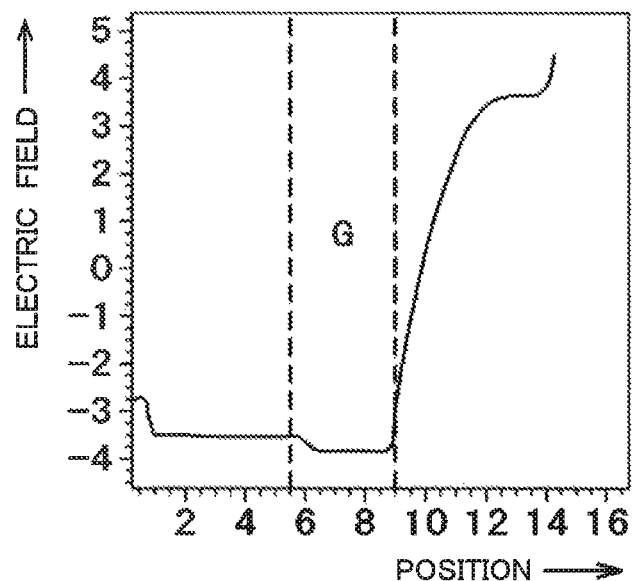
FIG. 10 is a graph illustrating the potential gradient near a TFT of a conventional LCD.

FIGS. 11 through 15 are graphs illustrating the relation between the distance d in FIG. 9 and the intensity of an electric field near the TFT. FIG. 10 is a graph obtained from a conventional LCD without floating electrodes 30 and illustrates the intensity of an electric field near its TFT. In FIG. 10, the horizontal axis represents position (μm), and the vertical axis represents potential (relative values). The area G surrounded by the two dotted lines represents the gate electrode 105. As illustrated in the figure, a potential gradient appears on the side close to the through-hole 120 (see also FIG. 9).

Figure 11:
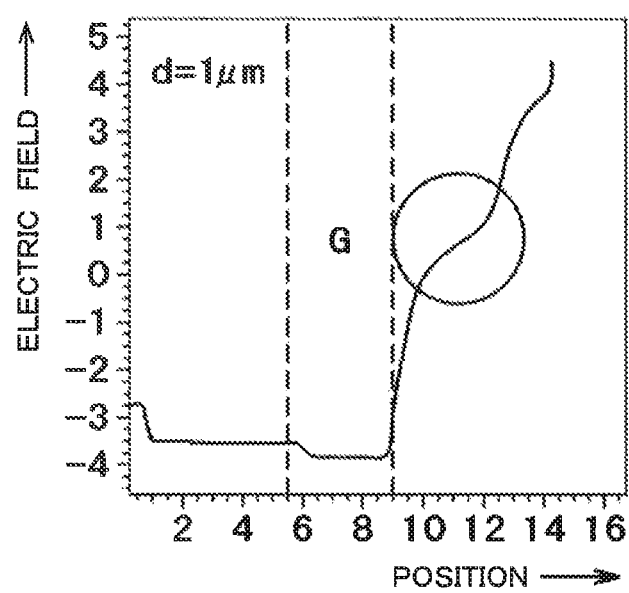
FIG. 11 is a graph illustrating the potential gradient of FIG. 9 when d is equal to 1 μm.

FIG. 11 illustrates the potential gradient when the distance d in FIG. 9 between the gate electrode 105 and the floating electrode 30 is equal to 1 μm. In FIG. 11, the circled area represents the area in which the electric field has been weakened by the floating electrode 30. As illustrated, the range in which the potential gradient is large is smaller in FIG. 11 than in FIG. 10. In other words, the average potential gradient on the side close to the through-hole 120 with respect to the gate electrode 105 is smaller in FIG. 11 than in FIG. 10.

Figure 12:
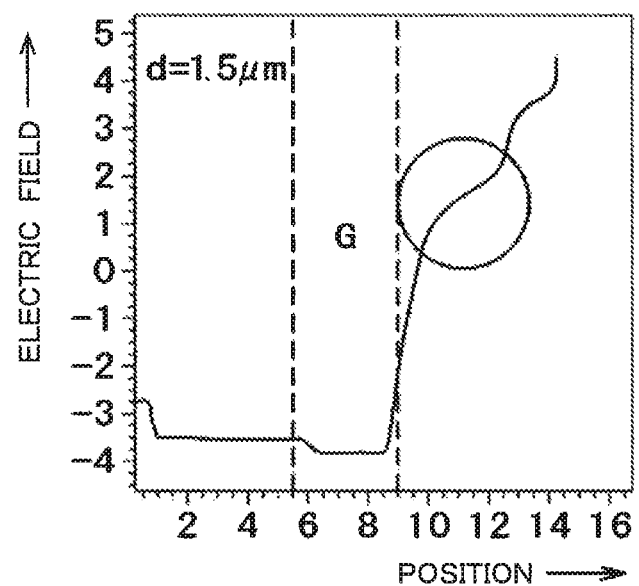
FIG. 12 is a graph illustrating the potential gradient of FIG. 9 when d is equal to 1.5 μm.

FIG. 12 illustrates the potential gradient when the distance d in FIG. 9 between the gate electrode 105 and the floating electrode 30 is equal to 1.5 μm. In FIG. 12, the circled area represents the area in which the electric field has been weakened by the floating electrode 30. As illustrated, the range in which the potential gradient is large is smaller in FIG. 12 than in FIG. 11.

Figure 13:
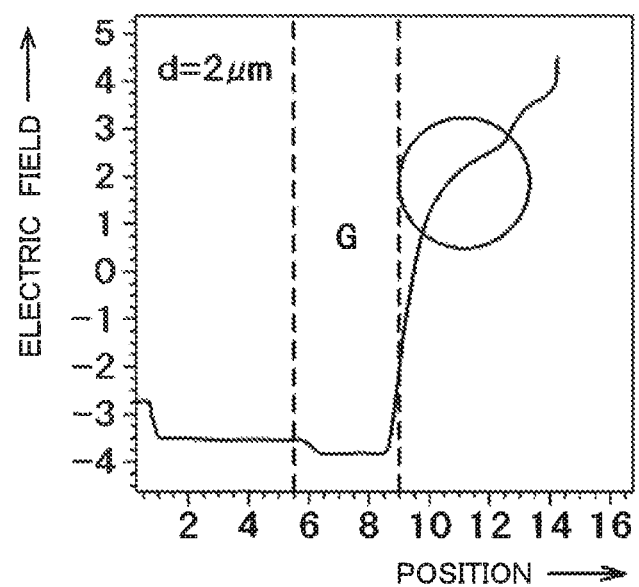
FIG. 13 is a graph illustrating the potential gradient of FIG. 9 when d is equal to 2 μm.

FIG. 13 illustrates the potential gradient when the distance d in FIG. 9 between the gate electrode 105 and the floating electrode 30 is equal to 2 μm. In FIG. 13, the circled area represents the area in which the electric field has been weakened by the floating electrode 30. As illustrated, the high potential area is located farther away from the gate electrode 105 in FIG. 13 than in FIG. 12. Thus, the average potential gradient on the side close to the through-hole 120 with respect to the gate electrode 105 is smaller in FIG. 13 than in FIG. 12.

Figure 14:
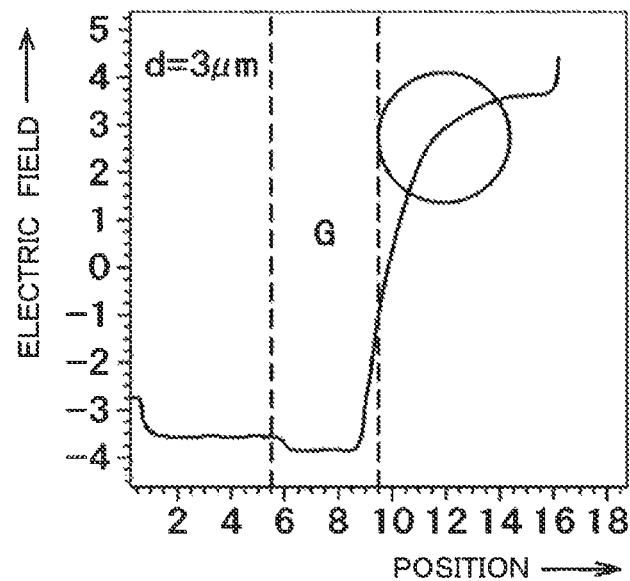
FIG. 14 is a graph illustrating the potential gradient of FIG. 9 when d is equal to 3 μm.

FIG. 14 illustrates the potential gradient when the distance d in FIG. 9 between the gate electrode 105 and the floating electrode 30 is equal to 3 μm. In FIG. 14, the circled area represents the area in which the electric field has been weakened by the floating electrode 30. In FIG. 14, since the floating electrode 30 is located at a relatively large distance from the gate electrode 105, the influence of the floating electrode 30 is smaller than in FIGS. 11 to 13. Nevertheless, the average potential gradient on the side close to the through-hole 120 with respect to the gate electrode 105 is smaller in FIG. 14 than in the conventional example of FIG. 10.

Figure 15:
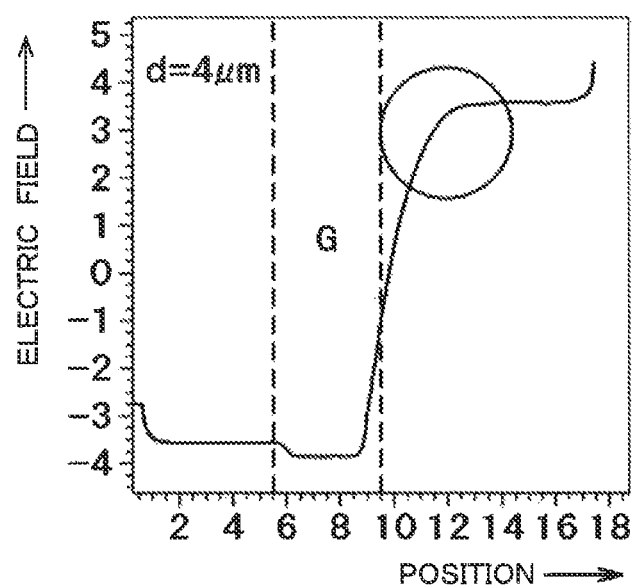
FIG. 15 is a graph illustrating the potential gradient of FIG. 9 when d is equal to 4 μm.

FIG. 15 illustrates the potential gradient when the distance d in FIG. 9 between the gate electrode 105 and the floating electrode 30 is equal to 4 μm. In FIG. 15, the circled area represents the area in which the electric field has been weakened by the floating electrode 30. In FIG. 15, since the floating electrode 30 is located at a larger distance from the gate electrode 105, the influence of the floating electrode 30 is still smaller. Thus, the effects of the floating electrode 30 are limited in the case of FIG. 15.

The results obtained from FIGS. 11 through 15 reveal that the distance between the gate electrode 105 and a floating electrode 30 in the extending direction of the semiconductor layer 103 is preferably in the range of 1 to 3 μm and more preferably in the range of 1 to 2 μm.

While we have discussed the influence of the distance between the gate electrode 105 and a floating electrode 30 on the potential gradient using the electrode arrangement model of FIG. 9, the same applies to the structures of FIGS. 2 to 4.

In principle, the greatest effect can be achieved when the gate electrode 105 is sandwiched between two floating electrodes 30. However, when only one floating electrode 30 can be placed close to the gate electrode 105 due to layout issues, it is more effective to place it on the high voltage side. Note however that in the case of a TFT disposed in a pixel, placing a floating electrode on either side of the gate electrode 105 does not make any difference. This is because that TFT is driven by voltages with inverted polarities.

On the other hand, when a TFT is placed at the edge of a display area to use it as a drive circuit, voltage polarities are not inverted. In this case, a floating electrode can be placed on a layer above the semiconductor layer, that is, on the high voltage side with respect to the TFT.

The invention can be applied not only to LCDs but also to electronic devices in general such as organic electroluminescence displays and TFT displays.

According to the invention, a floating electrode is placed, with respect to a TFT, on either the side closer to a data line or the side closer to the pixel electrode. Further, the floating electrode is formed on a layer above the semiconductor layer at the same time and with the same material as the gate electrode. Thus, the invention provides a reliable top- and single-gate TFT causing less current leakage, which results in a high-precision display device.

What is claimed is:

1. A liquid crystal display device comprising:
   a TFT substrate including:
      a plurality of gate lines extending in a first direction and arranged in a second direction;
      a plurality of data lines extending in the second direction and arranged in the first direction; and
      a plurality of pixel electrodes formed in the areas surrounded by the plurality of gate lines and the plurality of data lines;
   a counter substrate; and
   a liquid crystal layer sandwiched between the TFT substrate and the counter substrate,
   wherein a semiconductor layer and a gate electrode form a TFT with a gate insulating film placed therebetween,
   wherein the semiconductor layer is connected to one of the plurality of data lines on one side of the TFT and also connected to a contact electrode via a through-hole on the other side of the TFT,
   wherein the contact electrode is connected to one of the plurality of pixel electrode, and
   wherein a floating electrode is formed between the gate electrode and the through-hole on a layer above the semiconductor layer, the floating electrode being fabricated with the same material and at the same time as the gate electrode.

2. The liquid crystal display device of claim 1, wherein the TFT is used for a pixel.

3. The liquid crystal display device of claim 1, wherein the gate electrode is part of one of the plurality of gate lines.

4. The liquid crystal display device of claim 1, wherein the distance between the gate electrode and the floating electrode in the extending direction of the semiconductor layer is in the range of 1 to 3 μm.

5. The liquid crystal display device of claim 1, wherein the distance between the gate electrode and the floating electrode in the extending direction of the semiconductor layer is in the range of 1 to 2 μm.

6. The liquid crystal display device of claim 1, wherein the length of the floating electrode in the extending direction of the semiconductor layer is equal to or greater than the length of the gate electrode in the extending direction of the semiconductor layer.

7. The liquid crystal display device of claim 1, wherein the width of the floating electrode in a direction perpendicular to the extending direction of the semiconductor layer is less than the width of the one of the plurality of data lines and greater than the width of the semiconductor layer.

* * * * *